US007901977B1

(12) United States Patent
Angelopoulos et al.

(10) Patent No.: US 7,901,977 B1
(45) Date of Patent: Mar. 8, 2011

(54) DATA PROTECTION BY DETECTION OF INTRUSION INTO ELECTRONIC ASSEMBLIES

(76) Inventors: Marie Angelopoulos, Cortland Manor, NY (US); Teresita O. Graham, Irvington, NY (US); Sampath Purushothaman, Yorktown Heights, NY (US); Steve H. Weingart, Boca Raton, FL (US)

(*) Notice: Subject to any disclaimer, the term of this patent is extended or adjusted under 35 U.S.C. 154(b) by 0 days.

(21) Appl. No.: 09/492,210

(22) Filed: Jan. 27, 2000

(51) Int. Cl.
*H01L 51/40* (2006.01)

(52) U.S. Cl. .................... 438/99; 380/3; 380/4; 380/23; 438/780; 361/400; 428/544; 174/260

(58) Field of Classification Search .................. 380/4, 3, 380/23, 24; 438/780, 778, 779, 99; 361/412, 361/701, 424, 397, 400, 399; 428/544, 546, 428/901; 174/35 R, 35 MS, 260, 250
See application file for complete search history.

(56) References Cited

U.S. PATENT DOCUMENTS 5,027,397 A * 6/1991 Double et al. .................... 380/4
5,159,629 A * 10/1992 Double et al. .................... 380/4
5,177,324 A * 1/1993 Carr et al. .................. 174/35 R
5,301,231 A * 4/1994 Abraham et al. ................ 380/4
5,861,345 A * 1/1999 Chou et al. .................... 438/763
5,924,005 A * 7/1999 Waldo .......................... 438/623
6,013,538 A * 1/2000 Burrows et al. ................ 438/22
6,037,190 A * 3/2000 Chao et al. ...................... 438/35
6,072,130 A * 6/2000 Burgess ...................... 200/86 R
6,087,196 A * 7/2000 Sturm et al. .................... 438/29
6,114,645 A * 9/2000 Burgess ........................ 200/512

* cited by examiner

*Primary Examiner* — Matthew Smith
*Assistant Examiner* — Renzo Rocchegiani
(74) *Attorney, Agent, or Firm* — Thomas A. Beck; Daniel P. Morris

(57) ABSTRACT

Electronic assemblies, especially one containing volatile memory, used a flexible membrane with conducting lines which acts as an intrusion sensor against chemical and mechanical attacks. The lines are fabricated from inherently conducting polymers which are solution processed and directly patterned. The material was applied to a flexible polymer film by spin coating and patterned by application of a resist, followed by exposure/development of the resist and transferring the image into the polyaniline by reactive ion etching techniques. The conducting lines have high conductivity, tranparency properties which made them difficult to detect and possess excellent adhesion to the substrate film, as well as to the potting material which enclosed the structure. They also offered lightweight advantages over conventionally filled materials. These materials can also be used in conjunction with conventional conductor materials to further enhance protection against intrusion by sophisticated mechanical means.

13 Claims, 16 Drawing Sheets

DATA PROTECTION BY DETECTION OF INTRUSION INTO ELECTRONIC ASSEMBLIES

FIELD OF INVENTION

The present invention is directed to patterned electrically conducting polymers, novel materials for fabrication thereof and novel approaches to protecting and sealing these conductive lines. More particularly the present invention is directed to electronic assemblies, especially one containing volatile memory, which contain patterned conductive lines made of electrically conductive polymers, which act as an intrusion barrier against mechanical or chemical intrusion into such assemblies.

BACKGROUND

In many computer applications, it is desirable to protect the contests of the computer memory from unlawful or unauthorized intrusion with an intent to extract and read its contents. It is conventional practice to prevent reading of information electronically by providing certain encryption schemes wherein data is transmitted and received in an encrypted form and only authorized people who have the decryption key are able to read the data. There are many different types of encryption schemes which are useful in protecting the sensitive data against being read by unauthorized persons. Encryption keys and other sensitive data are often stored in I/C (integrated circuit) memory components within the computer. By use of software, the stored information is generally adquately protected from unauthorized persons using keyboard entries to attempt memory interrogation. However, an unauthorized person with the necessary skills and knowledge, and sufficient motivation can bypass software controls and attack the computer hardware directly. There are many attacks, some straightforward and well known, others more sophisticated, that allow direct interrogation of memory components and devices. One scheme of protection against such attacks is to provide some type of detecting means which detect any attempted mechanical intrusion into the sensitive area of the computer and, when such intrusion is detected, an alarm is given and/or a signal is sent to circuitry, which circuitry erases the data, thereby preventing the compromise of the information which was stored in the computer memory components. Various schemes have been proposed which provide for some type of electronic or electrical grid surrounding the computer circuitry and, when this electrical grid is broken or breached, the requisite signal is generated. Early schemes for such electronic detection are shown in U.S. Pat. Nos. 4,446,475 and 3,594,770. However, these early schemes have several drawbacks. One such drawback is that many grids are susceptible to very careful mechanical manipulation to allow the memory device to be accessed without breaking or otherwise compromising the circuit. In addition, some of these systems are susceptible to a type of attack wherein the materials which support the electrical grid are chemically attacked leaving access areas exposed to circumvent the electrical grid thus allowing physical intrusion into the memory components.

Still other more sophisticated attacks, through temperature modification or through ionizing radiation (e.g. x-rays) affect volatile memory devices such that an erasure command is not effective, thereby allowing the electrical grid to be circumvented.

A better scheme of protecting computer memory, is given in U.S. Pat. Nos. 5,027,397 and 5,159,629. This system overcomes the limitations mentioned previously by providing an outer intrusion detection layer that is highly resistant to chemical and mechanical attacks. The barrier includes a screen material surrounding the electronic assembly. The screened material has formed thereon fine conductive lines in close proximity to each other in a pattern that limits the mechanical access which can be achieved without disturbing the resistive characteristics of at least one line or line segment. The lines are formed using conductive particles of material dispersed in a solid matrix of material which loses its mechanical integrity when removed from the screen substrate. Electrical supply and signal detection means are provided which are adapted to supply a signal to the conductive lines and generate an output signal responsive to a given change in the resistance of the conductive lines whereby, when the resistance of the conductive lines changes, either as a result of chemical attack or mechanical attack, a signal is generated. This signal can be made to cause the erasure of information in the memory comment.

PRIOR ART

The prior art of producing the conductive lines in the screened material, can be seen in FIGS. 1-3, wherein the screen member 31 is comprised of a tough, flexible substrate such as film 32 of Mylar (a trademark of E.I. DuPont Co. for polyethylene terepthalate) having a serpentine pattern of screened conductive lines 33 thereon. The lines are comprised of conductive particles, such as particles 34 of silver and carbon which are dispersed in an organic substance, such as polyvinyl chloride. These lines are screened on to the Mylar by conventional screening processes and are sufficiently close together and of a size to provide a deterrent to mechanical probing of the circuit card. The lines were 0.25 mm wide and 0.013 mm thick and spaced on about 0.50 mm centers. A thin acrylic film 35 (FIG. 3) over the lines provides environmental protection to the lines from such things such as moisture, atmospheric contaminations or scratching. Referring to FIG. 1, the lines 33 are screened onto the substrate 32 by conventional screening techniques in a serpentine pattern such that they form two legs or segments 36 and 37 of substantially equal resistance, one leg 36 terminating in an electrical contact 38 and the other leg 37 terminating at electrical contact 39, both legs 36 and 37 having a common center electrical contact 40 in a bridge circuit.

The screen is formed with a pair of side flaps 41 which serve to protect the edges of the circuit card. The substrate 31 is also preferably provided with an adhesive backing 42, and as shown in FIG. 2, the screen member is partially wrapped around the superimposed circuit card, plastic preforms and lead strips. The screen preferably is provided with an alignment notch 41*a* (FIG. 1), which will reference to an alignment pin formed on the card 24 (FIG. 3). This, together with other pins will assure proper alignment of the screen 31 on the preform 27, 28, and card 24.

The electrical contacts 38, 39 and 40 are connected to their respective terminals on the circuit card 24 through openings 44 in the preform 27.

One of the limitations of this prior art structure and method is that the line width and spacing of the conductor pattern cannot be reduced to a more desirable range of 0.05 to 0.075 mm due to limitations in the printing technology. This limitation renders these structures ineffective against more sophisticated intrusion methods employing finer mechanical abrasion means and laser drilling means. Further, because of the make up of the conductors, the location of these lines can be discerned by a sophisticated intruder using microscopic or radiographic means as a result of the contrast between the conductors and their surrounding. This enables such an intruder to devise an optimum method to channel between the conductors using a more spatially controlled means and access the underlying module circuitry.

OBJECTS

It is the object of the present invention to provide a novel approach to producing conductive lines from inherently conducting polymers which are solution processable and directly patterned.

It is the object of the present invention to provide patterns of electrically conducting polymers that can be used in electronic assemblies, especially one containing volatile memory.

It is the object of the present invention to provide patterns of electrically conducting polymers by spin coating, solution casting, spray coating, roll coating, and vapor deposition.

It is another broad aspect of the present invention to provide patterns of electrically conducting polymers by the application of a resist on the conducting polymer whereby the resist is exposed to ultraviolet light and the pattern is transferred to the conducting polymer by etching followed by removal of the resist.

It is another object of the present invention to provide patterns of electrically conducting polymers by the use of a metal pattern as a mask which is applied to the conducting polymer, to act as a pattern transfer layer by an etching process.

It is another object of the present invention to provide patterns of electrically conducting polymers which exhibits excellent adhesion to a flexible polymeric carrier material.

It is another object of the present invention to provide patterns of electrically conducting polymers by direct photolithographic imaging of a suitable precursor polymer.

It is another broad aspect of the present invention to provide patterns of electrically conducting polymers that exhibit good conductivity, good thermal stability, no outgassing, flexibility and transparency.

It is another broad aspect of the present invention to provide patterns of electrically conducting polymers which are smaller in dimensions, thin, transparent and difficult to detect by visual, microscopic or radiographic means.

It is another broad aspect of the present invention to provide patterns of electrically conducting polymers which exhibit durability, such that folding of the structure will not cause cracks in the lines.

It is another broad aspect of the present invention to protect and seal the conductive lines by using organic fillers, such as silicones, epoxies and polyurethane materials.

It is another broad aspect of the present invention to provide electrically conducting polymers which have excellent adhesion and bonding to polyurethane.

It is another broad aspect of the present invention to provide electrically conducting polymers sealed and protected by polyurethane material dyed to a suitable color approriate to mask the conductive lines.

It is another broad aspect of the present invention to provide electrically conducting polymers that are dissolved or made electrically nonconductive by thermal or chemical means commonly employed to defeat intrusion barrier wraps used to protect electronic memory devices.

It is another broad aspect of the present invention to produce electrically conducting polymer lines on a flexible carrier layer along with other conducting patterns disposed on the said layer, so as to fabricate an improved intrusion barrier wrap that is very hard to defeat by mechanical or chemical means.

BRIEF DESCRIPTION OF THE DRAWINGS

Further objects, features, and advantages of the present invention will become apparent from a consideration of the following description of the invention when in conjunction with the drawings and figures in which.

DETAILED DESCRIPTION

The present invention is directed to electronic assemblies using electrically conducting polymers including substituted and unsubstituted polyanilines, polyparaphenylenes, polyparaphenyline vinylenes, polythiophenes, polypyrroles, polyfurans, polyselenophenes, polyisothianapthenes, polyphenylene sulfides, polyacetylenes, polypyridyl vinylenes, combinations thereof and blends thereof with other copolymers of the monomers thereof, as well as blends with thermoplastic or thermoset resins included. The conducting polymer can be spin-applied, dip coated, roller coated, spray coated on to a substrate or it can be in-situ chemically or electrochemically polymerized on a surface. The present invention is also directed to claims herein mentioned in patent application no. Y0996-238P, filed Nov. 10, 1997.

These materials are patterned into lines in a serpentine pattern on a flexible plastic wrap. Details of the methods employed to achieve this will be described in specific examples later. In order to utilize the flexible membrane (such as Kapton) with conducting polymer lines as an intrusion sensor, the lines are treated as resistors in a bridge or voltage divider circuit. Ideally all elements of the bridge or divider are equal segments of the conductive polymer lines on the substrate. By using this arrangement, the effects of temperature and electromagnetic interference (EMI) can be arranged to cancel which permits the circuitry to detect a smaller change during a real intrusion. Normal variations due to temperature, mechanical effects, EMI, etc. will not be detected. The best approach is when two segments are arranged so that the lines are parallel to each other for the entire length of the line, this gives the lines the property of a bi-filar wound coil which makes the resulting assembly very insensitive to EMI.

In order to detect the membrane, the bridge arrangement of lines is usually connected between the power source (Vcc) and ground (gnd). The sense point is usually set at the halfway point with equal resistance on each side, Vcc/2. This sense signal is delivered to a window comparator with the window center at Vcc/2. Some margin is added for the upper and lower thresholds based on the expected variations in the lines as a result of all things that can make them vary. The goal is to prevent the circuit from falsely detecting an intrusion caused by environmental changes, while always allowing it to detect real intrusions. (see FIG. 13)

Figure 14:
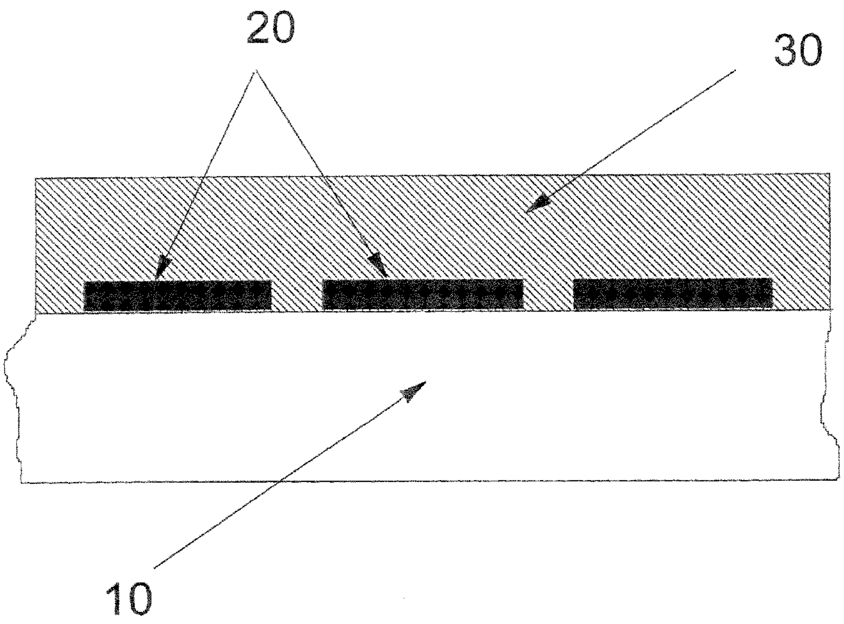
FIG. 14 shows a schematic cross section of the lithographically formed conducting polymer lines 20, on a flexible membrane 10 overcoated with a passivation layer 30 to form a single layer of conductive lines for an intrusion barrier structure.

In practice, the pattern of conducting lines on the Kapton film would be arranged such that puncturing or drilling or peeling of the potting material, would result in detection. The smallest hole that could be always detected would be a hole the size of one line and space pair. That would guarantee that at least one line would get completely broken through. In practice, one can often detect a hole the size of a line or space, or one half of the pair size. A schematic cross sectional view of such a structure using the conductive polymer lines in shown in FIG. 14.

Figure 13:
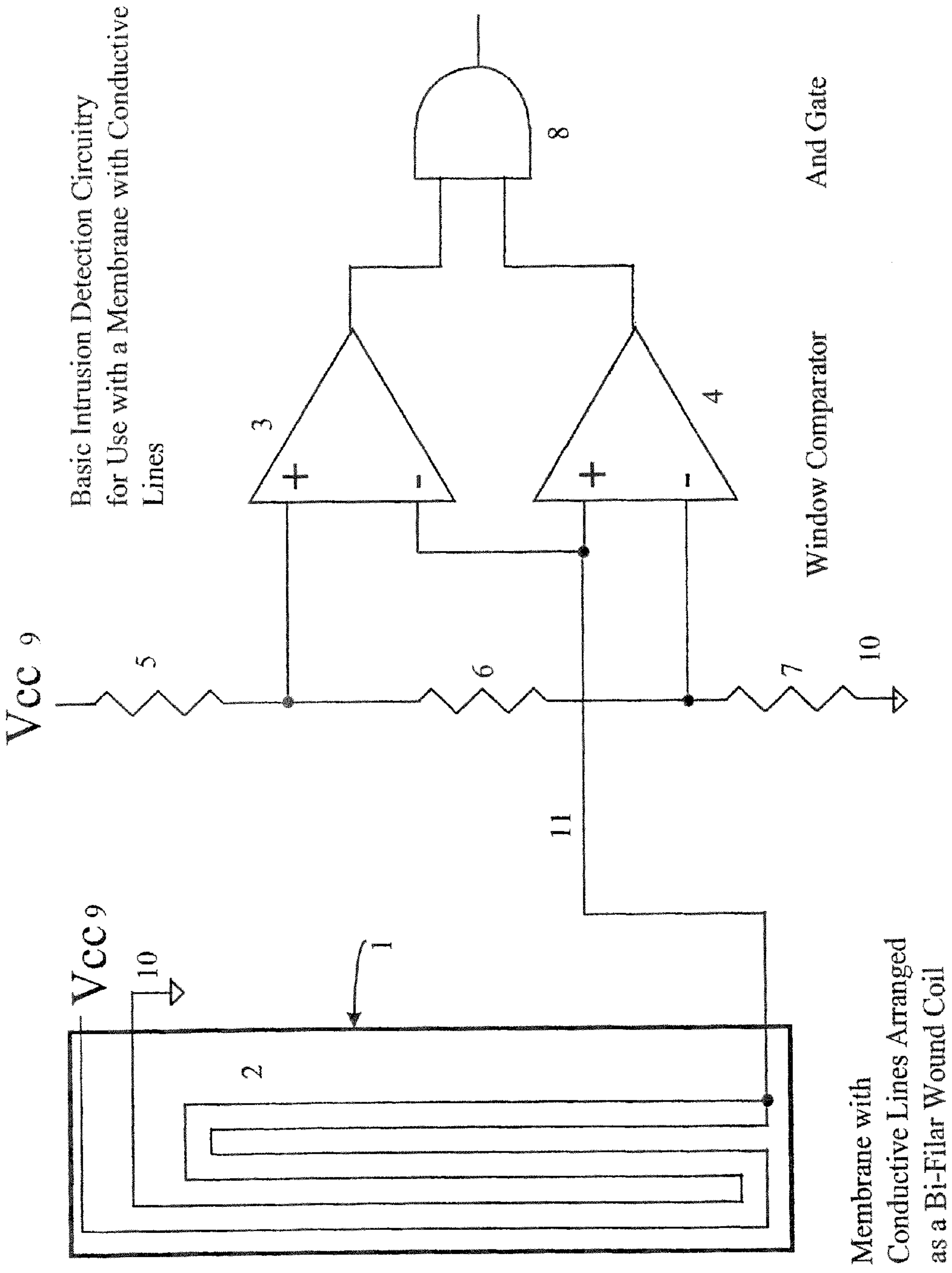
FIG. 13 is a circuit diagram of a circuit used for detecting mechanical or chemical intrusion through the Kapton membrane with conductive lines.

As shown in FIG. 13, conductive lines (2), on membrane (1) maybe arranged in a bi-filar configuration to minimize EMI and environmental effects. One end of the line is connected to Vcc (9) and the other to ground (10) such that the sensing signal (11), from the conductive lines is nominally at Vcc/2.

The sensing signal (11) is delivered to a window comparator comprised of two analog comparators (3 & 4) and window setting resistors (5, 6 & 7), arranged in the configuration shown in FIG. 13. The typical way on configuring the window setting resistors, is to use equal values for resistors 5 & 7, and to set the window size by setting resistor 6. The window size in volts will be Vcc*(R6/R6+R5+R7). The correct value is set during experimentation to determine the range of the sensing signal during variations in environmental conditions and EMI.

In normal operation sensing signal (11), delivered to the + terminal of comparator (4) is higher in voltage than the voltage at the junction of R6 & R7 which goes to the – terminal of comparator (4). This causes the output of comparator 4 to stay high. Sensing signal (11), also delivered to the – terminal of comparator (3), is also lower than the voltage at the junction of R5 & R6, so the output of comparator (3) stays high.

The outputs of the comparators are connected to an AND gate (8) so that when bother comparator outputs are in the high state, the output of the AND gate is also in the high state. A high state at the output of AND gate (8) indicates that there has been no tamper or damage to the conductive lines (2).

If the conductive lines are damaged, the voltage of sensing signal will change, and if it goes higher or lower than the window set by resistor (6), one of the comparator outputs will go to the low state, which will cause the AND gate to go to the low state, indicating tamper.

This indication of tamper can be used to notify an authority, set a signal indicating that tamper has occured, or it may activate other circuitry that responds to the tamper condition by doing things such as erasing the contents of an SRAM containing secret data.

Figure 15:
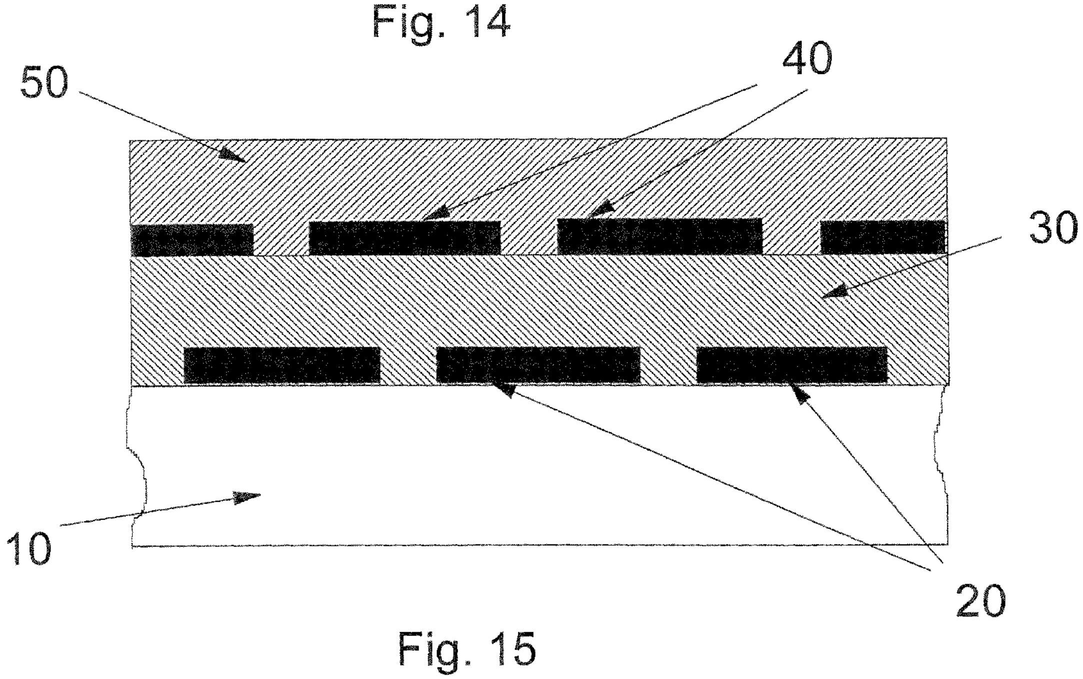
FIG. 15 shows a schematic cross section of an intrusion barrier structure with lithographically formed conducting polymer lines on a flexible membrane 10, comprising two layers of staggered conductive polymer lines 20 and 40 stacked on top of each other on the same side of the membrane with an insualting passivation coating 30 and 50 between them and over them, respectively.
Figure 16:
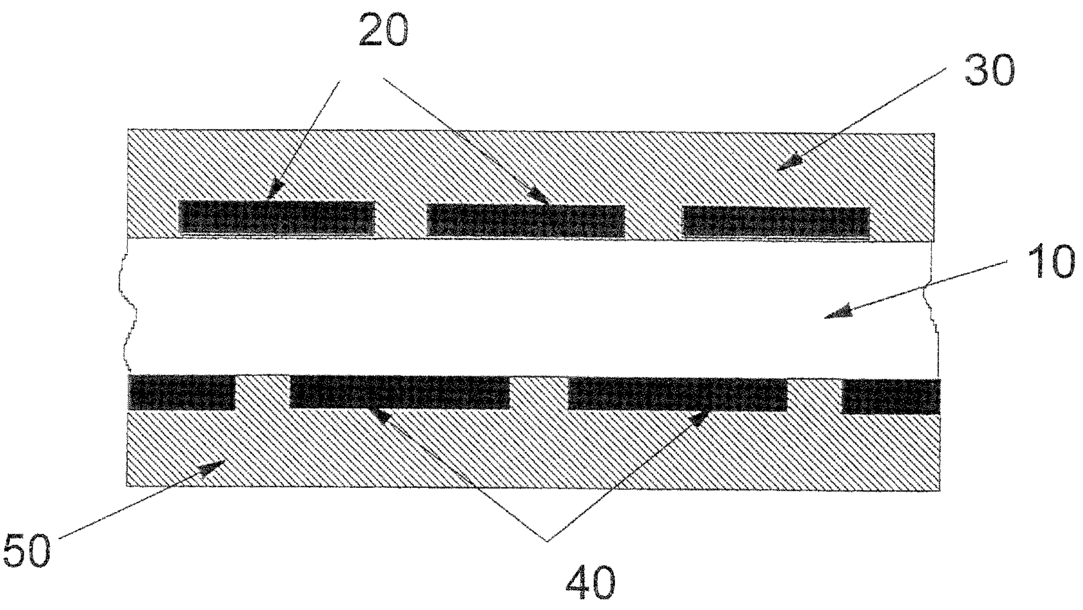
FIG. 16 shows a schematic cross section of an intrusion barrier structure with lithographically formed conducting polymer lines on a flexible membrane, wherein two layers of conductive polymer lines are disposed on either side of the membrane in a staggered arrangement and overcoated with a passivation layer.
Figure 17:
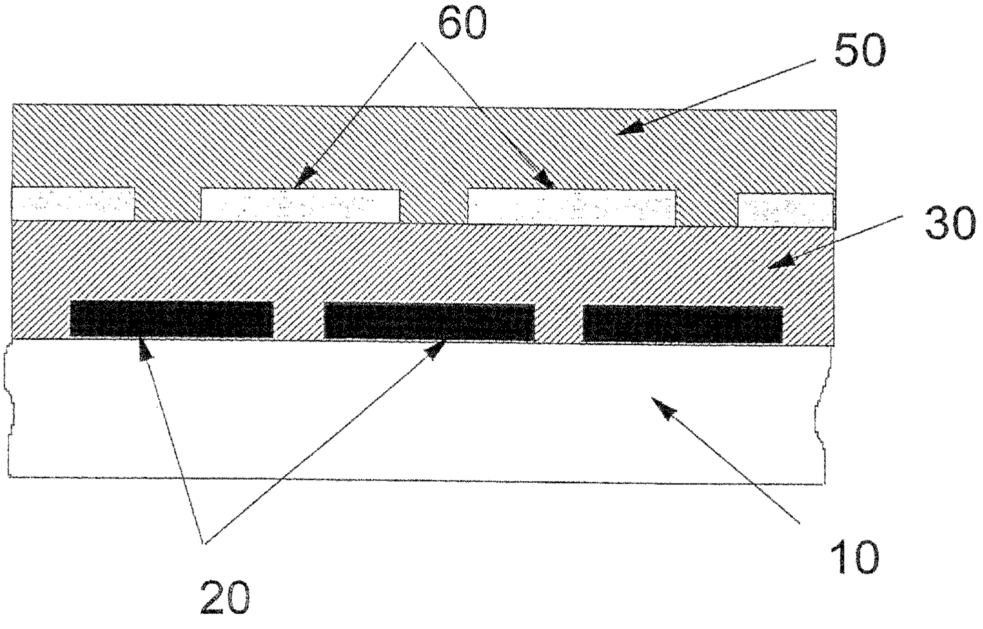
FIG. 17 shows a schematic cross section of an intrusion barrier structure comprising lithographically formed conducting polymer lines 20 on a flexible membrane 10, an overcoat of an insulating passivation layer 30, a second layer of staggered conducting lines made with conductive inks or pastes 60 described in the prior art and a final passivation overcoat 50.
Figure 18:
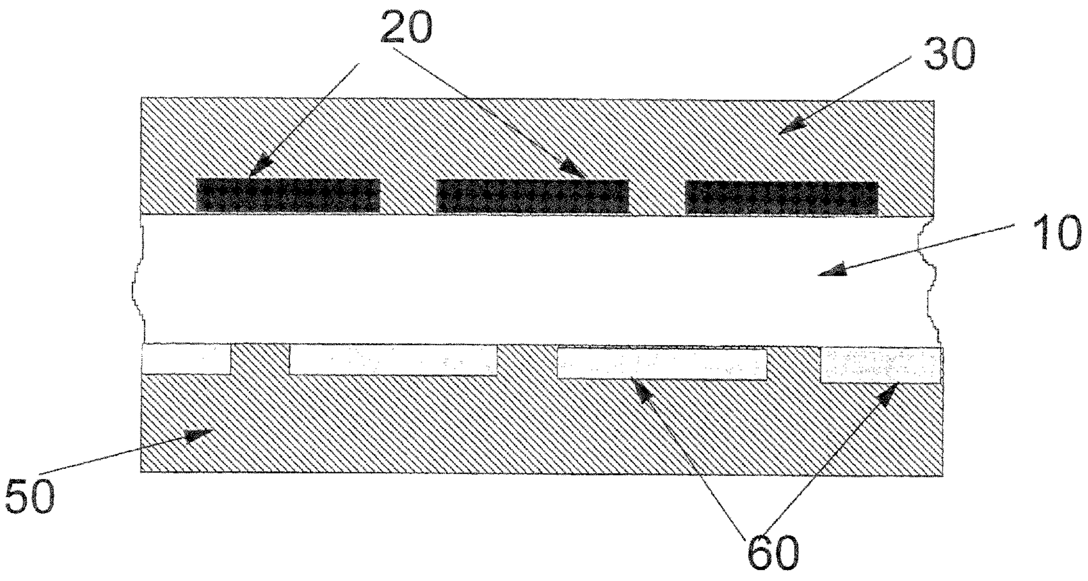
FIG. 18 shows a schematic cross section of an intrusion barrier structure comprising lithographically formed conducting polymer lines on one side of a flexible membrane overcoated with an insulating passivation layer, a second set of staggered conducting lines on the other side of the membrane made with conductive inks or pastes described in the prior art and a final passivation overcoat.
Figure 19:
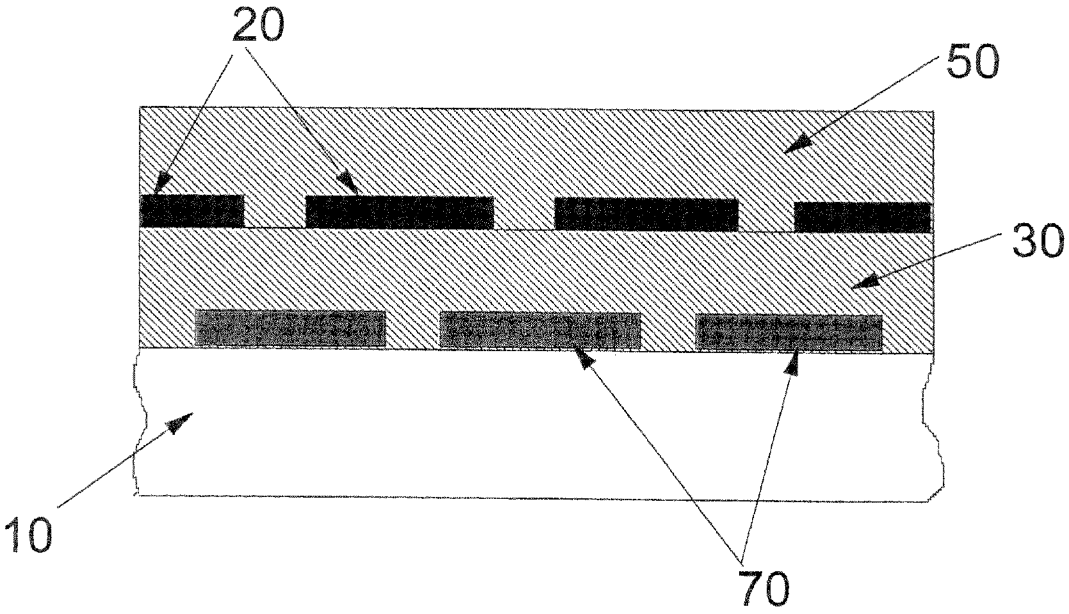
FIG. 19 shows a schematic cross section of an intrusion barrier structure comprising lithographically formed metallic lines 70 on a flexible membrane 10, an overcoat of an insulating passivation layer 30, a second layer of staggered conducting polymer lines 20 lithographically formed thereon, and a final passivation overcoat 50.
Figure 20:
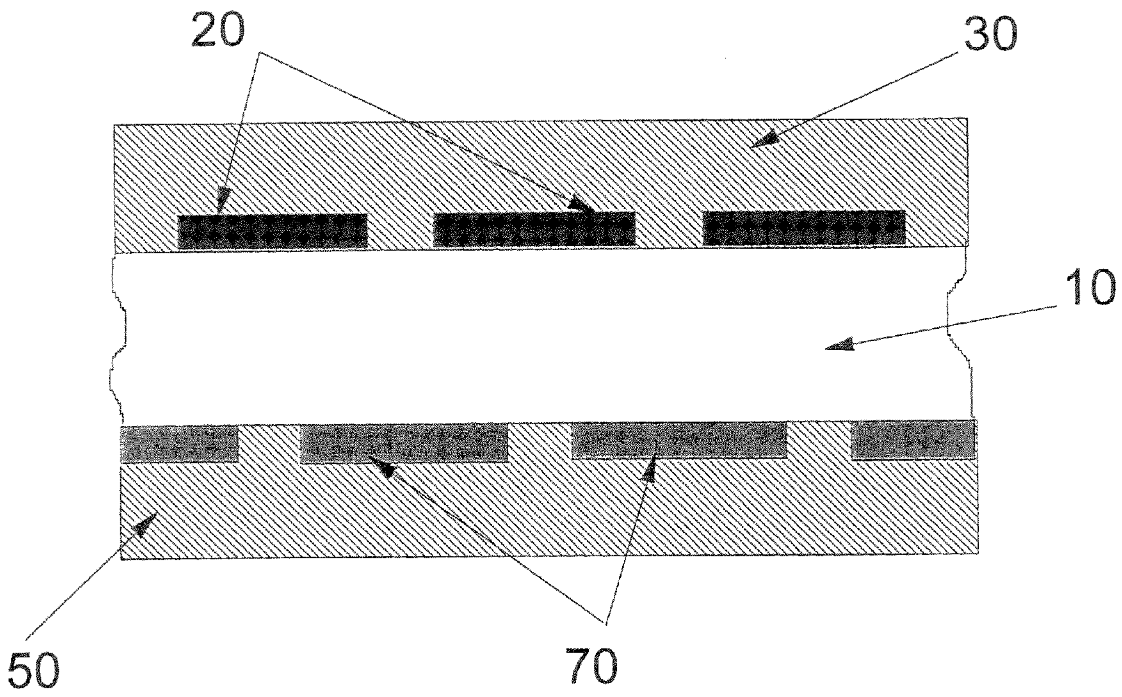
FIG. 20 shows a schematic cross section of an intrusion barrier structure comprising lithographically formed conducting polymer lines on one side of a flexible membrane overcoated with an insulating passivation layer, and a second set of staggered conducting lines on the other side of the membrane made with lithographically patterned metallic conductors overcoated with a second passivation layer.

Further improvements in this regard can be achieved by employing structures comprising a pair of spatially staggered conductor patterns such that the spaces between the lines in one pattern overlaps with the lines in the other pattern. This will make it virtually impossible for an intruder to avoid either one of the conductor patterns in any mechanical intrusion attempt. The two sets of lines can be made from any combination of lithographically patterned conducting polymers, patterned metallic conductors and screened on conductive ink traces. The two set of lines can be disposed on top of each other on the same side of the flexible wrap membrane with a separating insulator layer as in FIGS. 15, 17 and 19. Alternately, the two sets of lines could be disposed on either side of the flexible wrap membrane and overcoated with a passivation layer as shown in FIGS. 16, 18 and 20. The only consideration in these two conductor structures would be to choose the conductor materials and thickness such that the flexibility of the wrap in retained and the nearly transparent visual appearance of the conducting polymer films is taken full advantage of.

To apply this patterned membrane in manufacturing, the back side of the Kapton film is coated with a contact adhesive to adhere it to the package to be protected. First the lines are connected to the circuitry within the package. Then the membrane is folded around the package with the contact adhesive adhering the membrane to the package, and as the edges are folded onto each other like a gift wrap, the edges also adhere to each other. The contact adhesive should be such that it cannot be peeled from the contacted edges without damaging the lines that it touches.

Any cable or connections to the circuitry inside the package being protected should be brought out of the package via flat cables, through the seams of the folded package.

After the package is wrapped, it will be potted with a material that cannot practically be removed from the surface of the membrane without damaging the conductive lines on the surface of the membrane. Polyurethane potting/adhesive materials work well with the Kapton/polyaniline conducting lines used here.

SPECIFIC EXAMPLES FOLLOW

Example 1

Figure 1:
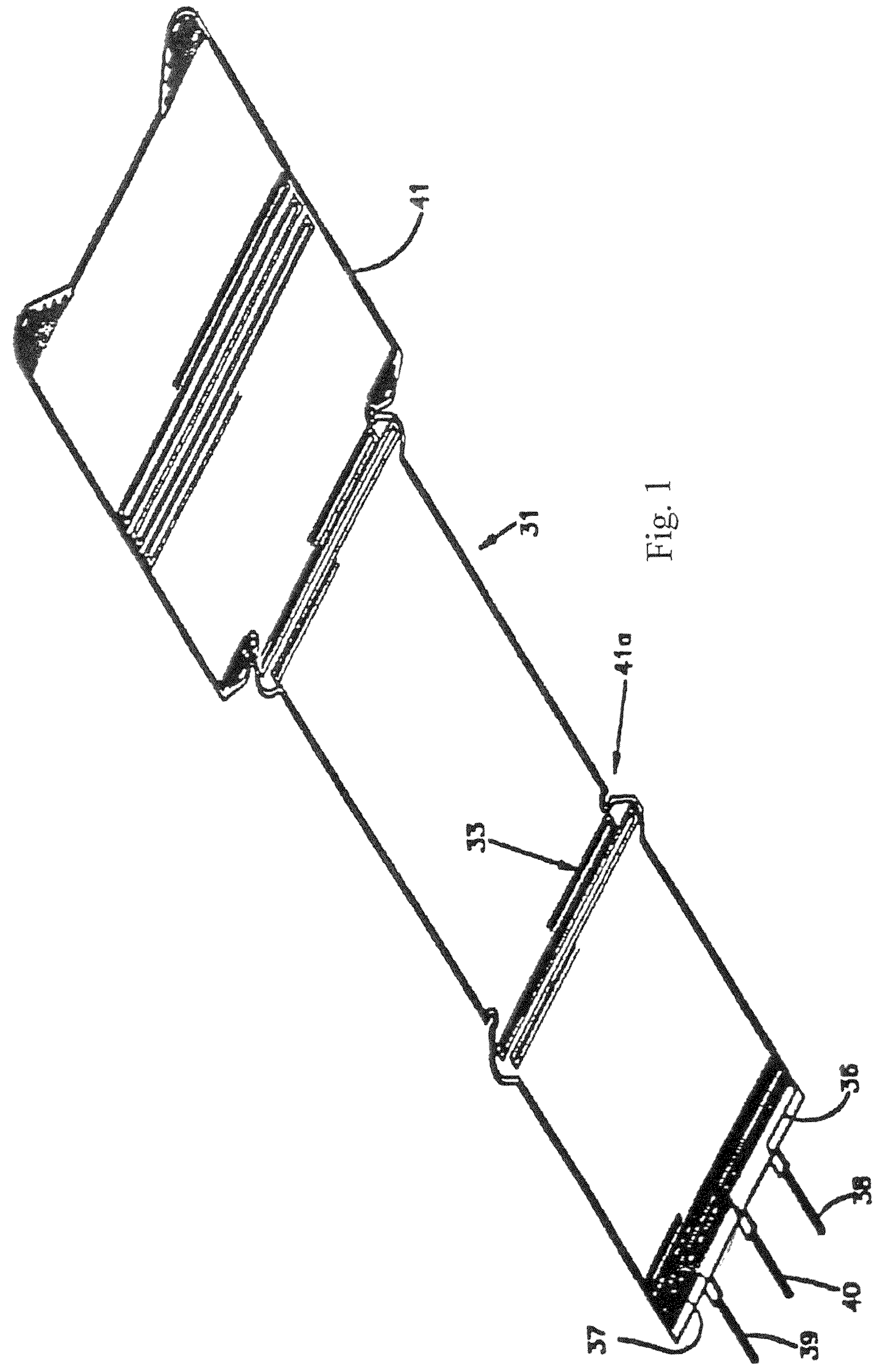
FIG. 1 is a perspective view, showing a flexible screen member used in the prior art of fabrication of the conductive lines.
Figure 2:
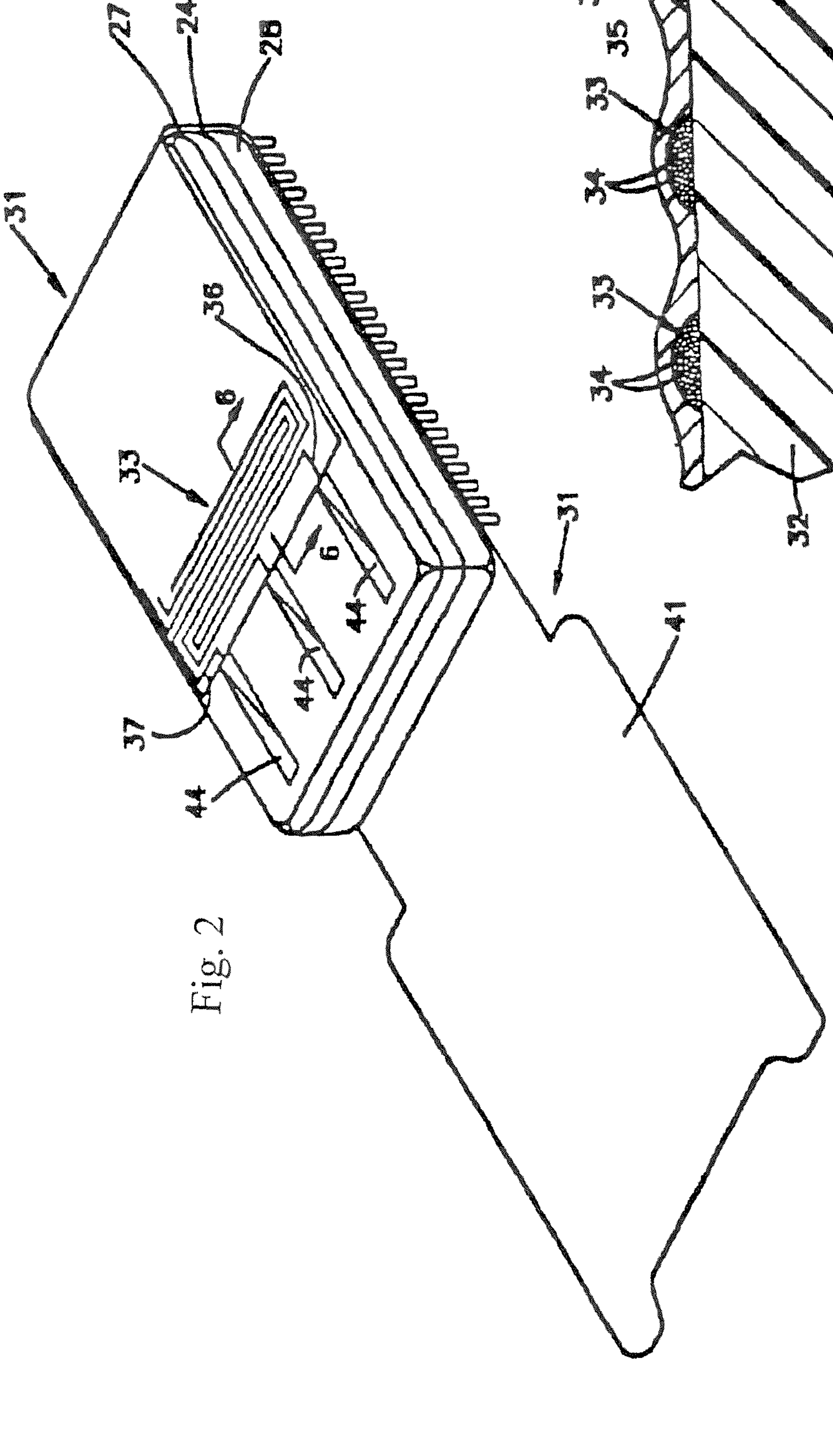
FIG. 2 is the system of FIG. 1 showing the flexible screen member partially wrapped thereon with screen leads attached to the circuit card.
Figure 3:
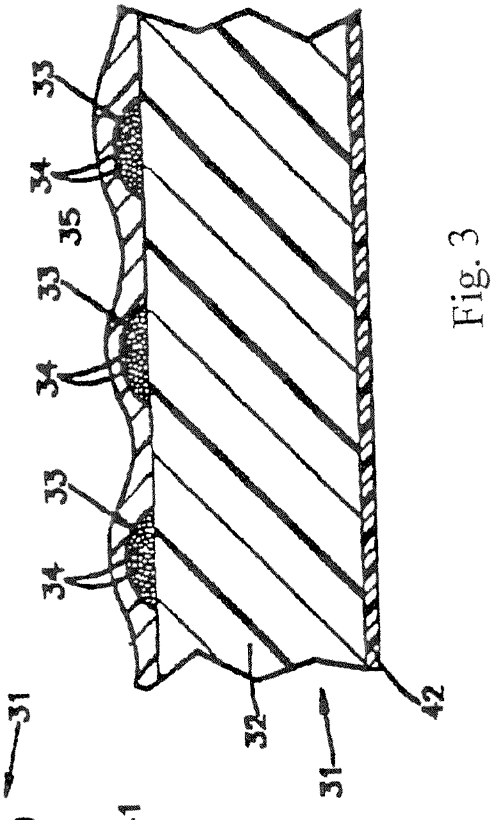
FIG. 3 is a sectional view taken substantially along the plane of line 6-6 of FIG. 2.
Figure 4:
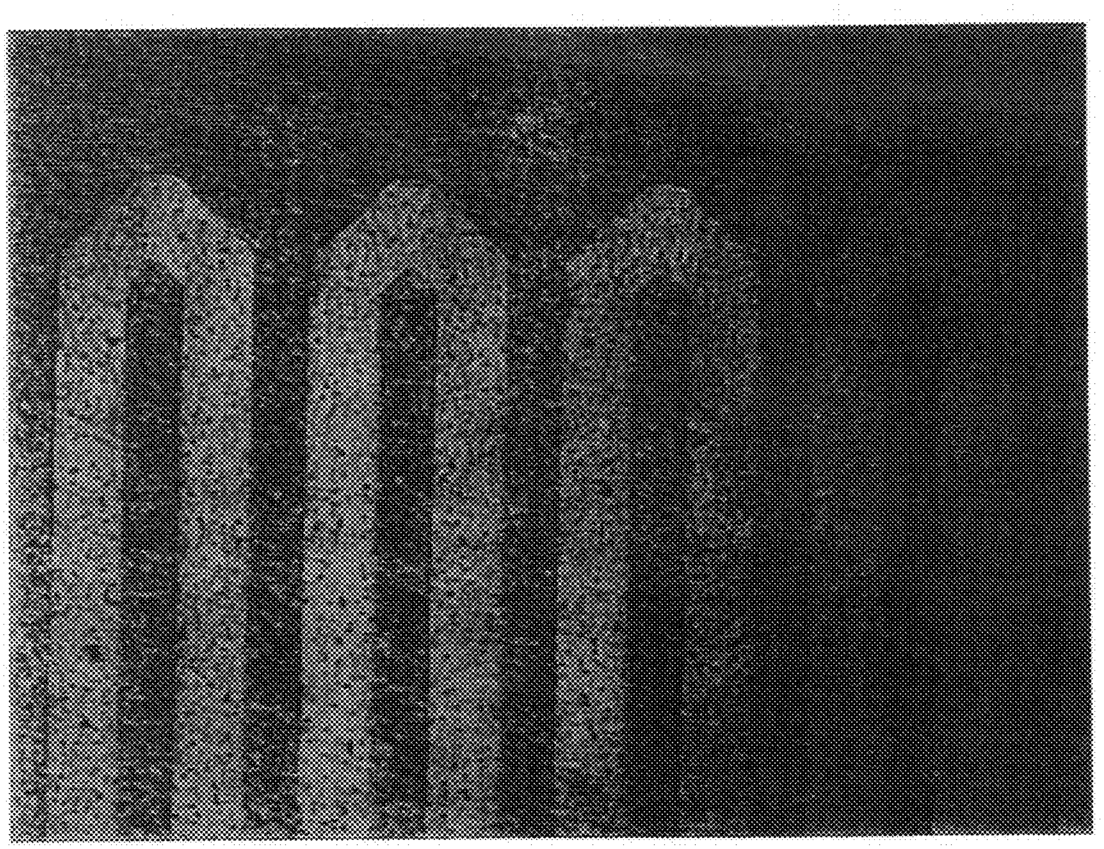
FIGS. 4 and 5 show 10 mils wide conducting polyaniline lines fabricated in a serpentine pattern for this application.
Figure 5:
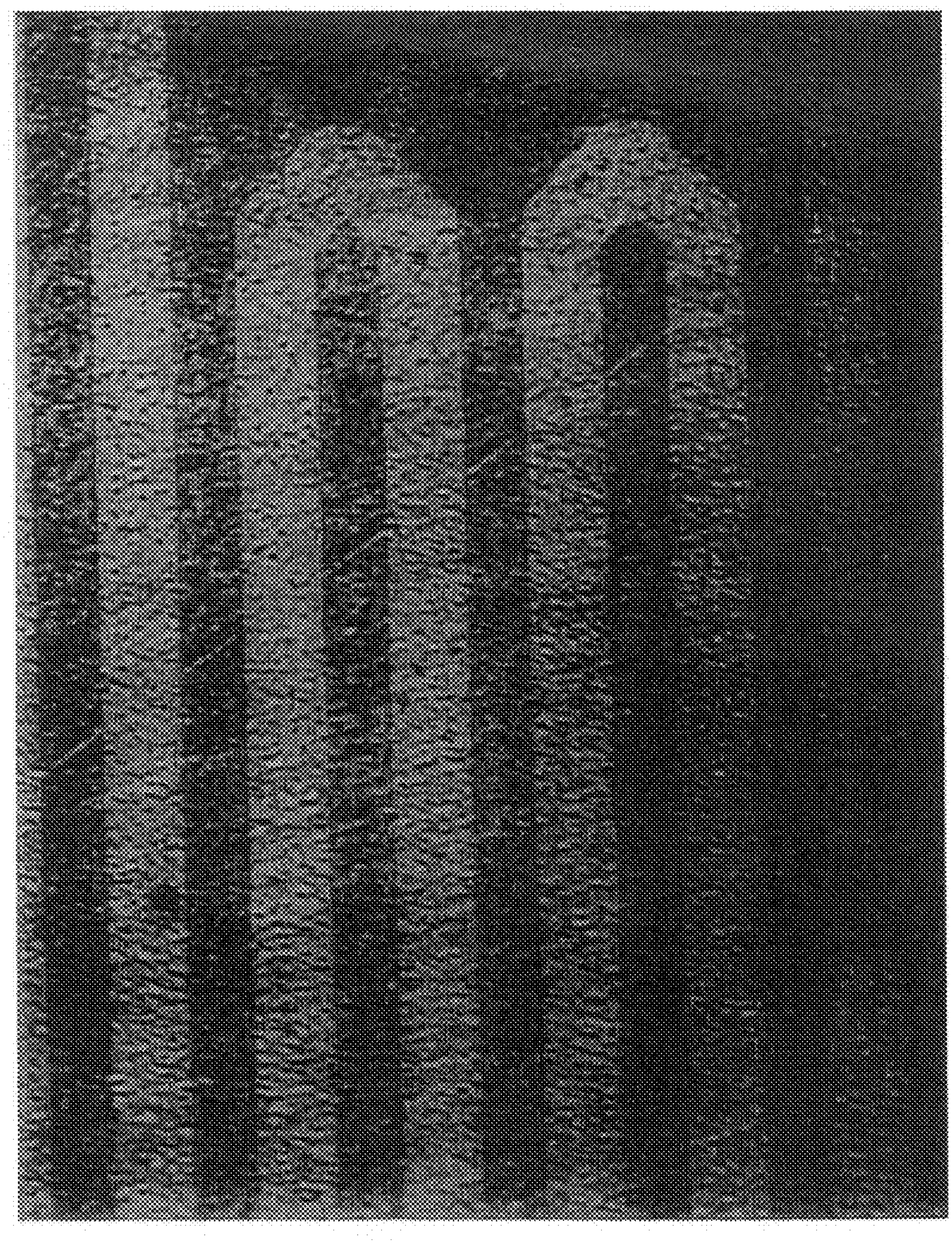
Figure 6:
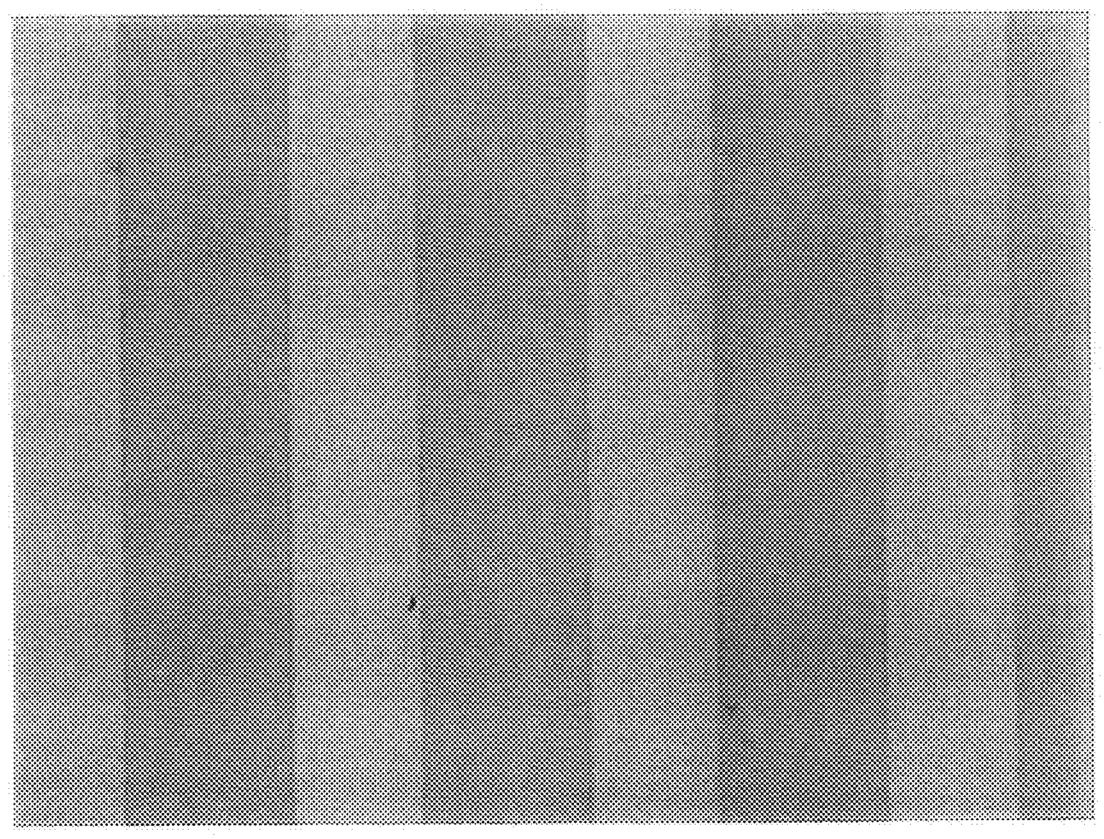
FIGS. 6 and 7 depict conducting polyaniline lines on the order of 10 μm delineated with the use of a photoresist on the surface of the conducting polymer.
Figure 7:
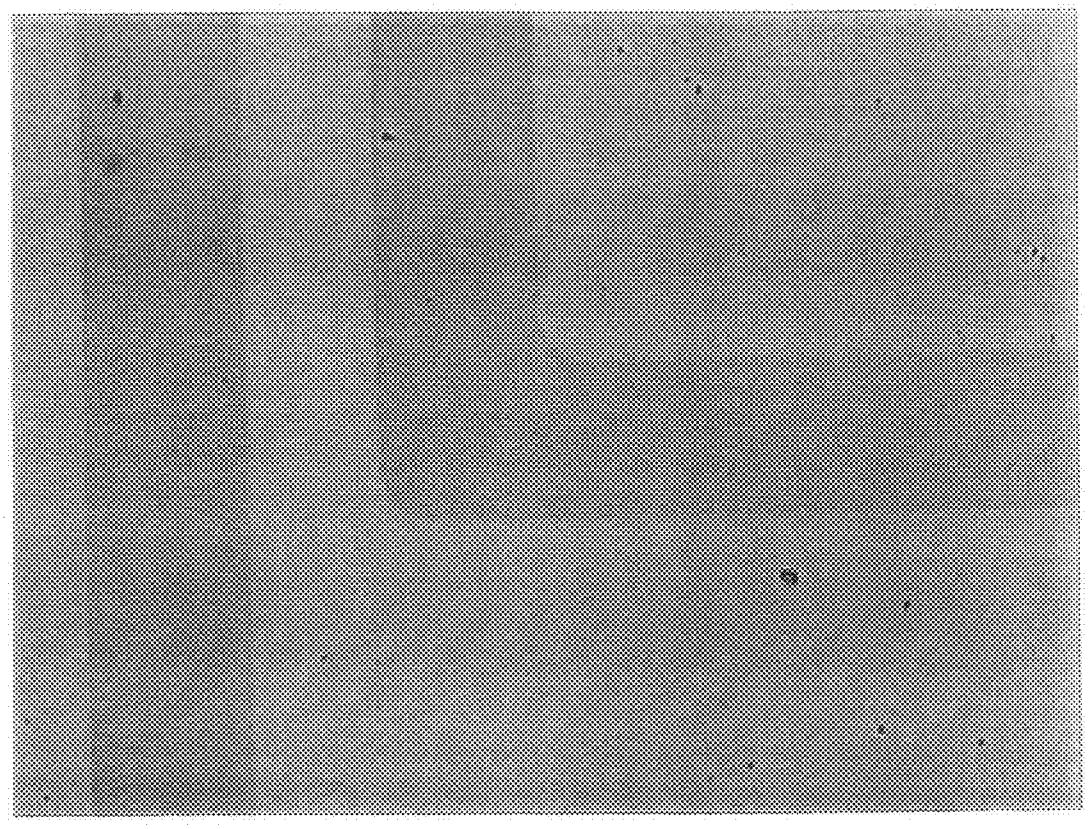

Polyaniline doped with acrylamidopropanesulfonic acid described in U.S. application Ser. No. 08/595,853 filed on Feb. 2, 1996, the teaching of which is incorporated herein by reference was spin applied on to a 1 mil thick, Kapton H film (a trademark of E.I. DuPont Co.) from a suitable solution including N-methylpyrrolidinone, m-cresol, dimethylpropylene urea, dimethylsulfodimethylformamide, etc. The surface of the Kapton film was first subjected to 8 minutes oxygen reactive ion etch treatment in order to achieve better adhesion of the polyaniline to the film substrate. The thickness of the coating can be controlled by the concentration of the polymer in solution as well as the spin speed. Generally a 5% solution was utilized of the polymer in a given solvent. The thickness of the coating ranged from 1800-2000 Angstroms. The conductivity of the film ranged from 1 to 150 S/cm. The coated film was baked in an oven at 85 C for 5 minutes to remove residual solvent. On to this polyaniline surface was applied a conventional Shipley photoresist (S-1808). The resist is baked at 85 C for 30 minutes. The resist coated polyaniline substrate was then exposed to ultra-violet light of 70 millijoules (mJ). The resist was subsequently developed in an aqueous alkaline Shipley Microposit CD-30 developer. As the developer which is alkaline can dedope the polyaniline and render the polyaniline less conducting, it is desirable that the developer and time of development be closely controlled. In this case, the developer concentrate is diluted with deionized water by 50%. The resist was developed for 30 seconds followed by a water rinse. The developed resist is then cured at 100 C for 30 minutes to strengthen the resist prior to image transfer. The resist image is then transferred to the polyaniline by oxygen reactive ion etching. The polyaniline was etched using 0.5 watt/sq. cm RF power load, 100 mtorr pressure and 20 sccm of oxygen gas in a reactive ion etching chamber for 7 minutes. After the image was transferred, the remaining photoresist was removed by washing with propylene glycol methyl ether acetate (PGMBA). 10 mil wide conducting polyaniline lines imaged in this fashion are shown in FIGS. 4 and 5. The conductivity of the polyaniline patterns was measured and found to be similar to the starting conductivity. The conducting lines produced are thin, transparent and adhere very well to the Kapton material. They are also very durable, and in combination with the flexibity of the Kapton film, folding of the whole structure did not cause any cracks in the lines. Ideal features are 1 mil lines and 1 mil spacings, which are easily achievable with the use of the inherently conducting polymer. FIGS. 6 and 7 showed 10 μm conducting polyaniline lines imaged in similar fashion.

Example 2

Poly(3-butylthiophene-2,5-diyl) was dissolved in a suitable solvent such as tetrahydrofuran, methyl ethyl ketone, N-methyl pyrrolidinone, etc and spin coated on a glass plate. The polythiophene was then doped by exposing the film to a chamber of iodine. The doped sample was then pumped under dynamic vacuum. A conductivity of 1000 to 2000 S/cm was attained. This film was patterned by applying the Shipley photoresist S-1808 as described above for the polyaniline.

Example 3

Poly(3-hexylthiophene-2,5 diyl) was also dissolved, coated and doped in the manner stated above and patterned as described in Example 1.

Example 4

Poly(3-octylthiophene-2,5 diyl) was treated and patterned as described above.

Example 5

Polypyrrole was deposited on a glass plate as follows. Pyrrole monomer (0.045M) was dissolved in 500 mil of water. In a second beaker was dissolved the oxidant ferric chloride (0.105M) in 500 mil of water. (0.105M) of 5-sulfosalicyclic acid and (0.105M) of anthraquinone-2-sulfonic acid sodium salt are then added to the oxidant solution glass plate which had one side masked was dipped into the monomer solution. The oxidant solution is then added to the monomer solution. The solution is allowed for 10 to 30 minutes to allow the polymerization of the monomer to proceed and deposit on the glass plate. The thickness of the conducting polypyrrole that deposits on the glass plate depends on the time the glass plate is allowed to sit in the polymerization bath. The polypyrrole had conductivity on the order of 200 S/cm. The polypyrrole deposited on the glass plate was then patterned as described above.

Example 6

Figure 8:
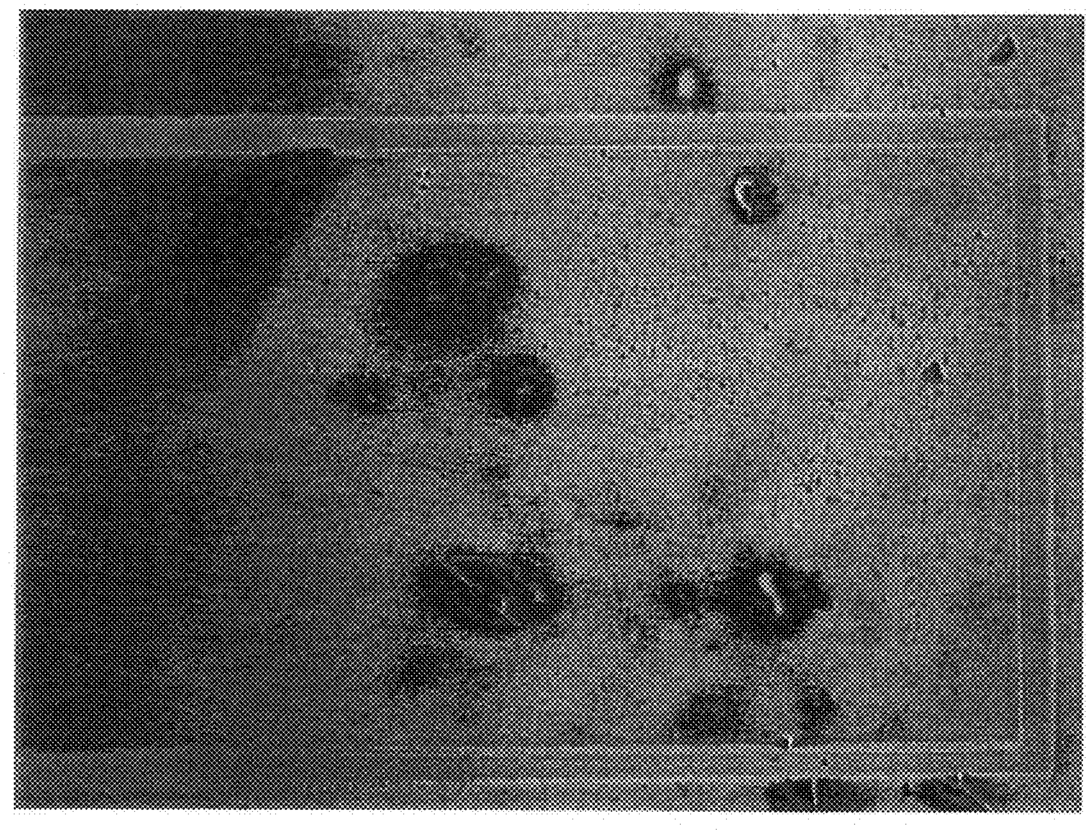
FIGS. 8 and 9 depict conducting polyaniline lines fabricated with the use of a blanket metal deposited on the surface of the conducting polymer which was imaged with the use of a resist.
Figure 9:
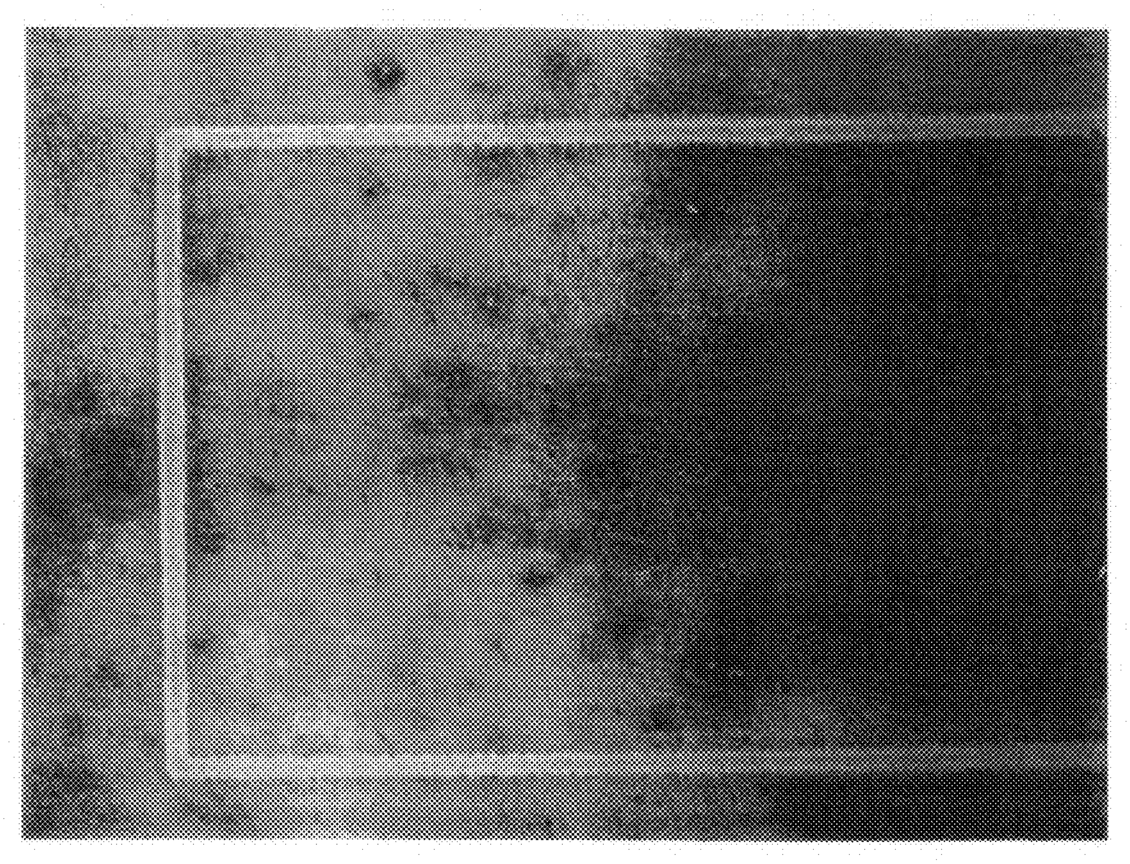

Polyaniline doped with acrylamidopropanesulfonic acid was spin-applied on to glass plate. 300 Angstroms of blanket aluminum was evaporated on the polyaniline. 2 μm thick, propylene glycol methyl ether acetate solvent based Shipley resist was applied on the aluminum. The resist was exposed to ultra-violet light at a dose of 70 mJ and subsequently developed with a 50/50 mixture of Shipley Microposit CD-30 developer and deionized water. After developing, the resist is baked at 85 C for 30 minutes. The pattern is then transferred to the aluminum by etching the aluminum at room temperature using an aluminum etch solution consisting of 80% phosporic acid, 5% acetic acid, 5% nitric acid, and 10% water. The etch rate was about 4 Angstroms/sec. The pattern in turn is transferred to the polyaniline by oxygen reactive ion etching using 20 sccm of oxygen at 100 mtorr pressure and 0.5 watt/sq.cm power load at an etch rate of 39 Angstroms/sec. An alternative to transfer the pattern to the polyaniline is to carry out the aluminum etch at 30 C elevated temperature, both the aluminum and the polyaniline are etched by the acid solution at a rate of 37 angstroms/sec. The remaining resist is removed by a propylene glycol methyl ether acetate rinse. The remaining aluminum is etched away using a dilute 25% dilute hydrochloric acid solution. FIGS. 8 and 9 depict conducting polyaniline patterned in this fashion.

Example 7

The substituted polythiophenes and in-situ polymerized polypyrrole described were also patterned using aluminum blanket metal as described for the polyaniline above.

Example 8

Figure 10:
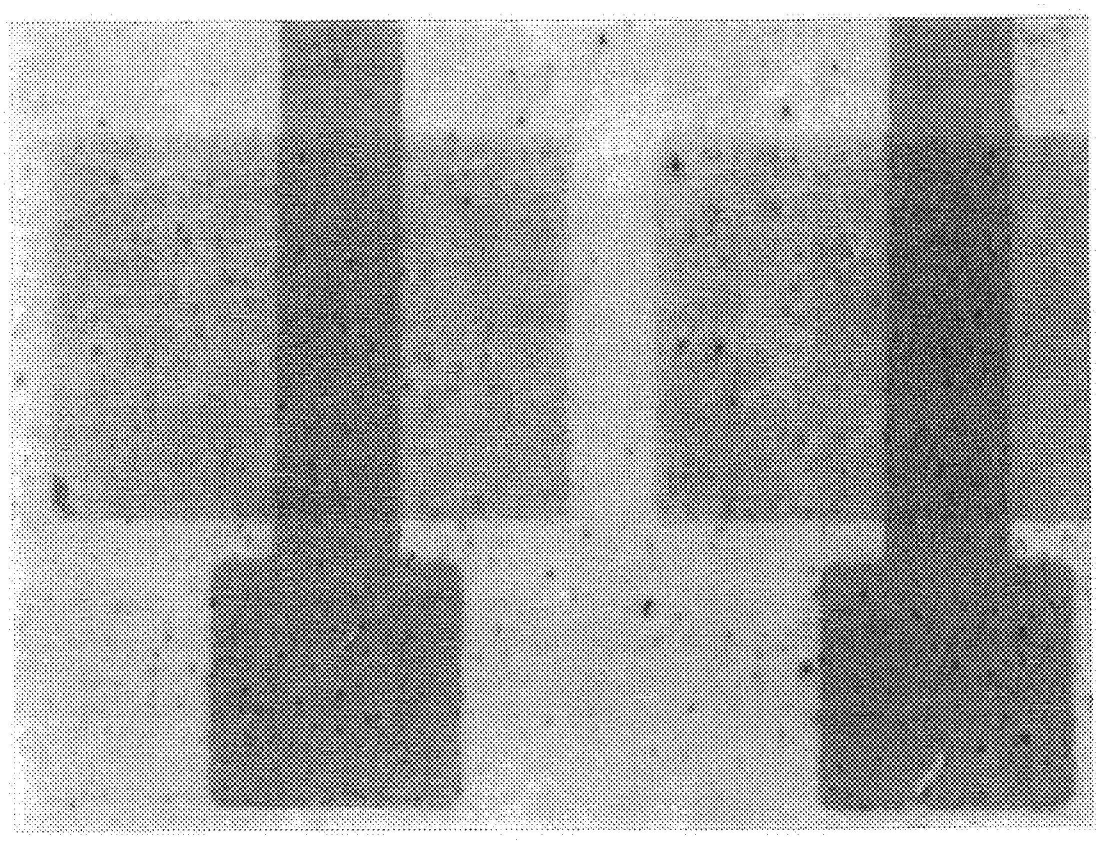
FIGS. 10, 11 and 12 show conducting polyaniline lines fabricated with the use of a metal deposited on the surface of the conducting polymer through a metal mask.
Figure 11:
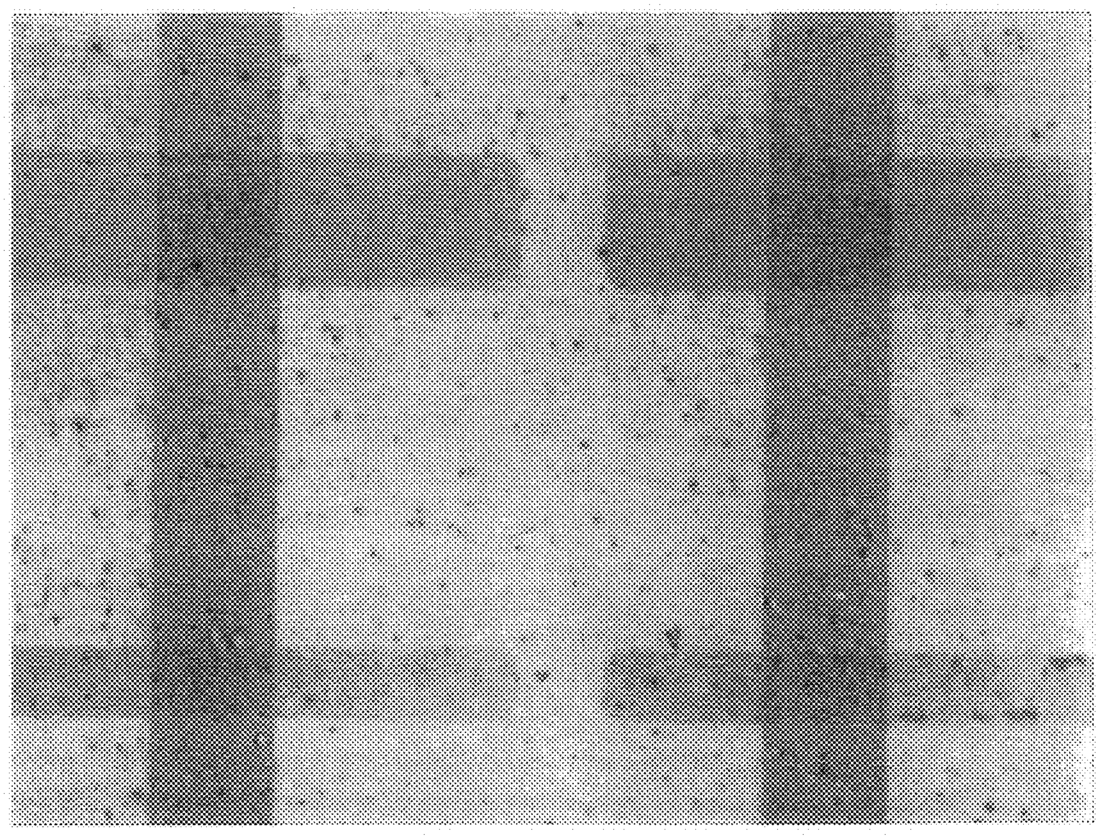
Figure 12:
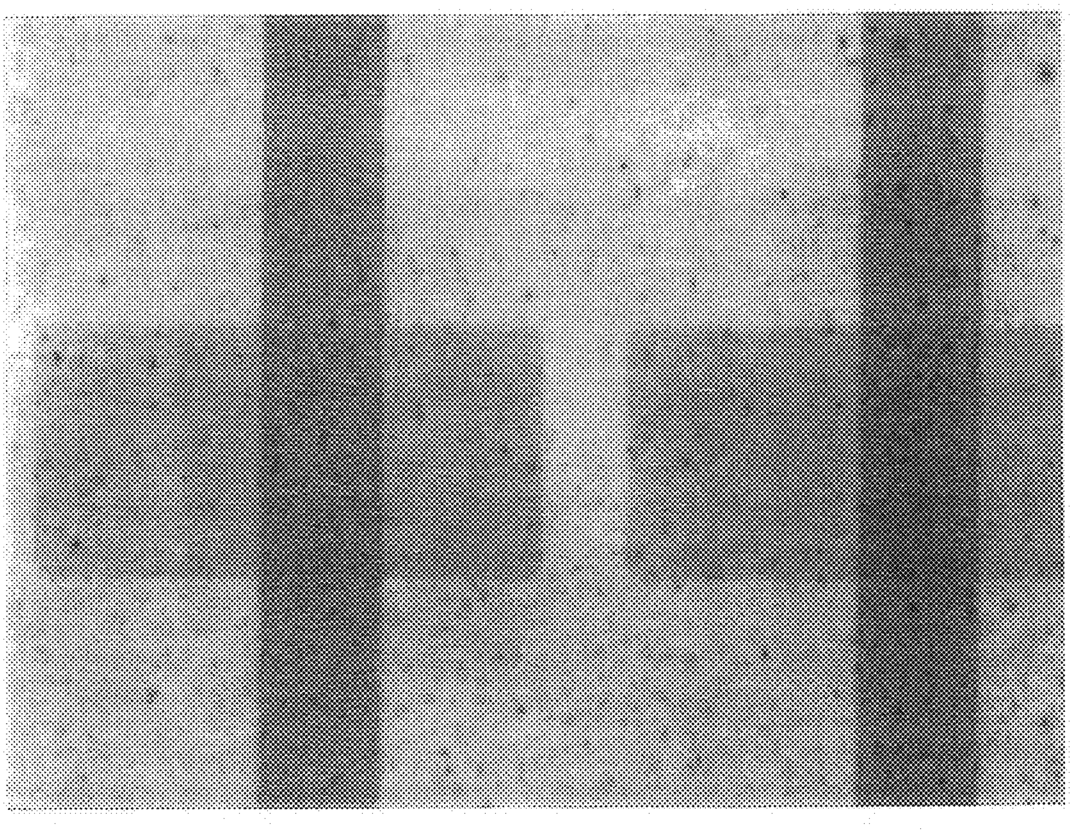

Polyaniline acrylamidopropanesulfonic acid was deposited onto a glass slide and a pattern of aluminum lines was then disposed thereon through a metal mask. The pattern was transferred to the polyaniline by oxygen reactive ion etching. The remainder of the aluminum was then etched with a dilute hydrochloric acid solution. Patterns produced by this method are shown in FIGS. 10, 11 and 12.

Example 9

The substituted polythiophenes and in-situ polymerized polypyrroles can also be patterned in the fashion outlined in Example 8.

Example 10

A polyurethane potting material was applied to the surface of the Kapton film with the patterned conducting polyaniline lines obtained using the lithographic process described in Example 6 above. A desirable property of the potting material is that it should adhere well to both the Kapton and the polyaniline conducting lines. If there is any noticeable difference in adhesion, it should adhere to the lines better than the Kapton in order to increase the likelihood of breaking the lines if the potting material is lifted or peeled during an intrusion attempt. The material should not also damage or significantly alter the properties of the conducting polymer lines, or damage the structure in general. Polyurethane potting material met all these desired criteria. It can also be dyed to a color appropriate to mask the slight greenish hue of the conducting polyaniline lines to further make the detection of the location of the conducting lines very difficult. The bonding of the polyurethane potting was excellent, such that an attempt made to remove any spots for an access to the conducting lines was not successful. Typical resistance measured of the structure ranged from 92 Kohms-10.2 Mohms which is in the acceptable range of the security circuitry described earlier.

Example 11

Polyaniline doped with acrylamidopropanesulfonic acid was deposited onto a glass slide. Conductivity was measured using a 4-probe conductivity meter to be about 100 S/cm. The glass slide was dipped for 10 seconds in an acetone solution. Conductivity was measured and found to be reduced by about 90%. Further immersion in the solution, the polyaniline coated on the glass slide lost its conductivity totally.

Another glass slide was coated with polyaniline doped with acrylamidopropanesulfonic acid. Conductivity was measured using a 4-probe conductivity meter. The glass slide was dipped for 10 seconds in propylene glycol methyl ethyl acetate. Conductivity was measured and found to be reduced by about 67%. With further immersion in the solution, the film eventually lost its conductivity.

Other solvents which have similar effects on polyaniline are toluene, xylem, benzene, mesitylene, propylene carbonate, butyrolactone, cyclohexanone, diglyme, tetrahydrofuran, N-methyl pyrrolidinone, methyl ethyl ketone and methyl alcohol.

Polyaniline doped with acrylamidopropanesulfonic acid was deposited onto a Kapton film. The polyaniline film was patterned using a typical photoresist/develop lithographic process. A polyurethane potting material was applied to the surface of the Kapton film with the patterned conducting polymer lines. The epoxy coated structure was immersed in a solution of N-methyl pyrrolidinone. The solution dissolved the potting material, as well as the patterned conducting polymer lines inside the structure. Other solvents which give similar effects are phenols and their derivatives.

What is claimed is:

1. An electronic assembly, especially one containing volatile memory which contains a membrane as an intrusion sensor which is fabricated by spin coating an electrically conducting polymer onto a polymer film;

patterning the conducting polymer;

and encasing said film substrate and conducting lines with potting material.

2. A structure according to claim 1 wherein said electrically conductive material is selected from the group of one or more of substituted and unsubstituted polyparaphenylene vinylenes, polyparaphenylenes, polyanilines, polythiophenes, polyazines, polyfuranes, polypyrroles, polyselenophenes, poly-p-phenylene sulfides, polyacetylenes combinations thereof and blends thereof with other polymers and copolymers of the monomers thereof.

3. A structure according to claim 1 wherein said electrically conducting lines are laminated with dry film material to mask the lines.

4. A structure according to claim 1 wherein said potting material are organic silicones, epoxies and polyurethane.

5. A structure according to claim 1 in which said potting material is dyed to an opaque color or a color matched with the conducting lines so as to camoflauge their presence in the said structure.

6. An electronic assembly, especially one containing volatile memory provided with a membrane wrap as an intrusion sensor which is fabricated by applying first, an electrically conducting polymer onto a polymer film;

patterning the first conducting polymer into lines;

encasing said conducting lines with a first insulating passivation layer;

applying a second electrically conducting polymer on said first passivating layer;

patterning said second conducting polymer into lines that are spatially staggered with respect to the set of lines in said first conducting polymer;

and overcoating and encasing the layers and the polymer support film with a potting material.

7. An electronic assembly, especially one containing volatile memory provided with a membrane wrap as an intrusion sensor which is fabricated by applying a first electrically conducting polymer onto a polymer film;

patterning the first conducting polymer into lines;

applying a second electrically conducting polymer on the other side of the membrane wrap;

patterning said second conducting polymer into lines that are spatially staggered with respect to the set of lines formed in said first conducting polymer;

and overcoating and encasing the layers and the polymer support film with a potting material.

8. An electronic assembly, especially one containing volatile memory provided with a membrane wrap as an intrusion sensor which is fabricated by applying an electrically conducting polymer onto a polymer film;

patterning the said conducting polymer into lines;

encasing said conducting lines with an insualting passivation layer;

screening and curing a conductive ink pattern on the insulating passivation layer such that the conductive ink pattern is spatially staggered with respect to the pattern in the said conducting polymer;

and overcoating and encasing the layers and the polymer support film with a potting material.

9. An electronic assembly, especially one containing volatile memory provided with a membrane wrap as an intrusion sensor which is fabricated by applying an electrically conducting polymer onto a polymer film;

patterning the said conducting polymer into lines;

screening and curing a conductive ink pattern on the other side of the membrane wrap such that the conductive ink pattern is spatially staggered with respect to the pattern in the said conducting polymer;

and overcoating and encasing the layers and the polymer support film with a potting material.

10. An electronic assembly, especially one containing volatile memory provided with a membrane wrap as an intrusion sensor which is fabricated by screening and curing a conductive ink pattern on the membrane wrap;

applying an insulating passivation layer over the said conductive ink pattern;

applying an electrically conducting polymer polymer onto said passivation layer;

patterning the said conducting polymer into lines such that the conductive ink pattern is spatially staggered with respect to the pattern in the said conducting polymer;

and overcoating and encasing the layers and the polymer support film with a potting material.

11. An electronic assembly, especially one containing volatile memory provided with a membrane wrap as an intrusion sensor which is fabricated by producing lithographically defined pattern of metallic conductor lines on the membrane wrap;

applying an insulating passivation layer over the said metallic conductor pattern;

applying an electrically conducting polymer onto said passivation layer;

patterning the said conducting polymer into lines such that the metallic conductor pattern is spatially staggered with respect to the pattern in the said conducting polymer;

and overcoating and encasing the layers and the support polymer film with a potting material.

12. An electronic assembly, especially one containing volatile memory provided with a membrane wrap as an intrusion sensor which is fabricated by producing lithographically defined pattern of metallic conductor lines on the membrane wrap;

applying an electrically conducting polymer on the other side of the membrane wrap;

patterning the said conducting polymer into lines such that the metallic conductor pattern is spatially staggered with respect to the pattern in the said conducting polymer;

and overcoating and encasing the layers and the polymer support film with a potting material.

13. An electronic assembly, especially one containing volatile memory provided with a membrane wrap as an intrusion sensor which is fabricated by applying an electrically conducting polymer onto a polymer film;

patterning the said conductor polymer into lines;

applying a passivation overcoat on the said conducting polymer line pattern;

producing a lithographically produced metallic conductor line pattern on said passivation overcoat such that it is spatially staggered with respect to the said conducting polymer line pattern;

and overcoating and encasing the layers and the polymer support film with a potting material.

* * * * *